United States Patent
Tajiri

(10) Patent No.: US 8,541,822 B2
(45) Date of Patent: Sep. 24, 2013

(54) SEMICONDUCTOR DEVICE AND METHOD FOR PRODUCING THE SAME

(75) Inventor: Masayuki Tajiri, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 791 days.

(21) Appl. No.: 12/591,340

(22) Filed: Nov. 17, 2009

(65) Prior Publication Data

US 2010/0127310 A1      May 27, 2010

(30) Foreign Application Priority Data

Nov. 21, 2008   (JP) ................ 2008-298163

(51) Int. Cl.
 *H01L 29/78*   (2006.01)
 *H01L 21/336*  (2006.01)

(52) U.S. Cl.
 USPC ............ 257/288; 257/E29.255; 257/E21.409

(58) Field of Classification Search
 USPC ....................................... 257/288
 IPC ......................... H01L 21/8238, 29/80
 See application file for complete search history.

(56) References Cited

U.S. PATENT DOCUMENTS

| 5,734,181 | A | 3/1998 | Ohba et al. | 257/77 |
| 5,998,302 | A | 12/1999 | Fujisawa | 438/706 |
| 6,297,100 | B1 * | 10/2001 | Kumar et al. | 438/268 |
| 2004/0179147 | A1 * | 9/2004 | Kiya et al. | 349/55 |

FOREIGN PATENT DOCUMENTS

| JP | 62-137849 | 6/1987 |
| JP | 2004-345068 | 12/1992 |
| JP | 07-153695 | 6/1995 |
| JP | 07-153770 | 6/1996 |
| JP | 08-264453 | 10/1996 |
| JP | 08-306642 | 11/1996 |
| JP | 2009-064346 | 3/1997 |
| JP | 2009-139498 | 5/1997 |
| JP | 09-213673 | 8/1997 |
| JP | 10-112488 | 4/1998 |
| JP | 2010-214794 | 8/1998 |
| JP | 2007-005481 | 1/2007 |

* cited by examiner

*Primary Examiner* — Jarrett Stark
*Assistant Examiner* — Lawrence Tynes, Jr.
(74) *Attorney, Agent, or Firm* — Harness, Dickey & Pierce, P.L.C.

(57) ABSTRACT

A semiconductor device comprising at least two wiring layers on a substrate or a surface layer of the substrate, wherein a lower wiring layer of the two wiring layers contains silicon, and a silicon carbide layer is placed between the lower wiring layer and an upper wiring layer.

6 Claims, 3 Drawing Sheets

SEMICONDUCTOR DEVICE AND METHOD FOR PRODUCING THE SAME

CROSS-REFERENCE TO RELATED APPLICATION

This application is related to Japanese application No. 2008-298163 filed on Nov. 21, 2008, whose priority is claimed under 35 USC §119, the disclosure of which is incorporated by reference in its entirety.

BACKGROUND OF THE INVENTION

1. Field of the Invention

The present invention relates to a semiconductor device and a method for producing the same. More particularly, the present invention relates to a semiconductor device comprising at least two wiring layers and having a structure in which electric conduction between the two wiring layers can be ensured when a lower wiring layer of the two wiring layers is composed of silicon, and to a method for producing the semiconductor device. In particular, the present invention can be suitably used for a stacked transistor which comprises: a pair of drift layers being formed on a surface layer of a silicon substrate and having a channel therebetween; and a source/drain laminated on the drift layers, and to which a normal scaling law is hard to apply as handling a high voltage or a large electric current.

2. Description of the Related Art

An MOS transistor is known which has a structure in which a conductive region (lower wiring layer) is formed on a surface layer of a silicon substrate by implanting impurities into the substrate, and an upper wiring layer such as a polysilicon layer is directly formed on the conductive region. Since the conductive region is composed of silicon, a natural oxide film grows thereon before the formation of the upper wiring layer. Formation of the upper wiring layer without removing the natural oxide film may result in failure in attaining normal electric conduction between the conductive region and the upper wiring layer. As methods for ensuring the electrical conduction, therefore, there have been proposed a method in which the natural oxide film is removed before the formation of the upper wiring layer, a method in which growth of the natural oxide film is inhibited, and the like. Specifically, the following methods have been proposed.

In Japanese Unexamined Patent Publication No. 2007-5481 (Patent Document 1), a chlorine ($Cl_2$) gas is introduced into a furnace for formation of an upper wiring layer before deposition of the upper wiring layer to remove a natural oxide film on a conductive region.

In Japanese Unexamined Patent Publication No. HEI 9(1997)-213673 (Patent Document 2), Japanese Unexamined Patent Publication No. HEI 7(1995)-153770 (Patent Document 3), and Japanese Unexamined Patent Publication No. HEI 7(1995)-153695 (Patent Document 4), a hydrogen fluoride (HF) gas is introduced into a furnace for formation of an upper wiring layer before deposition of the upper wiring layer to remove a natural oxide film on a conductive region.

In Japanese Unexamined Patent Publication No. SHO 62(1987)-137849 (Patent Document 5), a $C_3F_8$ gas is introduced into a reaction chamber of a CVD apparatus for formation of an upper wiring layer and heated before deposition of the upper wiring layer to remove a natural oxide film on a conductive region.

In another method, as disclosed in Japanese Unexamined Patent Publication No. HEI 10(1998)-112488 (Patent Document 6) and Japanese Unexamined Patent Publication No. HEI 8(1996)-306642 (Patent Document 7), a natural oxide film on a conductive region is removed by a reducing gas or plasma treatment in advance in a furnace different from a furnace for deposition of an upper wiring layer before the deposition of the upper wiring layer, and subsequently a silicon substrate is carried to the furnace for the deposition of the upper wiring layer which is filled with an inert gas such as nitrogen, and then the upper wiring layer is formed.

In another method, as disclosed in Japanese Unexamined Patent Publication No. HEI 8(1996)-264453 (Patent Document 8), a silicon substrate is carried to a furnace at a low temperature (150° C. or lower) in order to inhibit oxidation of a surface of a conductive region, and subsequently the inside of the furnace is brought to an inert atmosphere and then heated for deposition of an upper wiring layer, though the concept of the method is different from that of the above-described seven methods.

SUMMARY OF THE INVENTION

Since the reducing gas has corrosive properties in Patent Documents 1 to 5, maintenance of piping, valves, filters, and the like of the production apparatus is complicated, and increased number of times of the maintenance is needed, leading to decrease of working efficiency of the production apparatus. In addition, replacement of the atmosphere in the furnace before the deposition of the upper wiring layer takes time, and therefore treatment is prolonged. As a result, costs are increased.

In addition to such a problem, Patent Documents 6 and 7 require a mechanism between the furnace for the preliminary treatment and the furnace for the deposition of the upper wiring layer for carrying in the silicon substrate so that the substrate is isolated from the atmospheric air. Therefore, the production apparatus is complicated and increased in size.

In Patent Document 8, the production apparatus itself is simpler, but the effect is restrictive, because the natural oxide film that grows on a lower wiring layer while the silicon substrate is carried from an apparatus for preliminary treatment such as HF cleaning to an apparatus for the formation of the upper wiring layer cannot be inhibited. In addition, depending on the capacity of the reaction chamber of the apparatus for the formation of the upper wiring layer, it takes time to raise the temperature from 150° C. or lower up to a temperature for the deposition of the upper wiring layer (usually, approximately 600° C.). Furthermore, when the temperature is reduced to 150° C. or lower, the upper wiring layer attached to an inner wall of the reaction chamber peels off due to stress, which can be a cause of dust to be generated in the reaction chamber.

While the lower wiring is formed on the surface layer of the silicon substrate in the above-mentioned publication, a natural oxide film is formed also on a surface of a lower wiring composed of a silicon layer formed on a substrate to block conductivity, and therefore it has been desired to remove the natural oxide film.

In view of the above-described problems, the present invention has been achieved to provide a semiconductor device attaining normal electric conduction between wiring layers, in which growth of a natural oxide film is effectively inhibited without the use of a corrosion gas that requires complicated maintenance or a complicated and expensive production apparatus.

The present invention provides a semiconductor device comprising at least two wiring layers on a substrate or a surface layer of the substrate, wherein a lower wiring layer of the two wiring layers contains silicon, and a silicon carbide layer is placed between the lower wiring layer and an upper wiring layer.

Furthermore, the present invention provides a method for producing a semiconductor device, the method comprising the steps of: forming a silicon carbide layer on a lower wiring layer or a surface layer of the lower wiring layer, the lower wiring layer being composed of silicon and formed on a substrate or a surface layer of the substrate; and forming an upper wiring layer on the silicon carbide layer.

DESCRIPTION OF THE PREFERRED EMBODIMENTS

Figure 1:
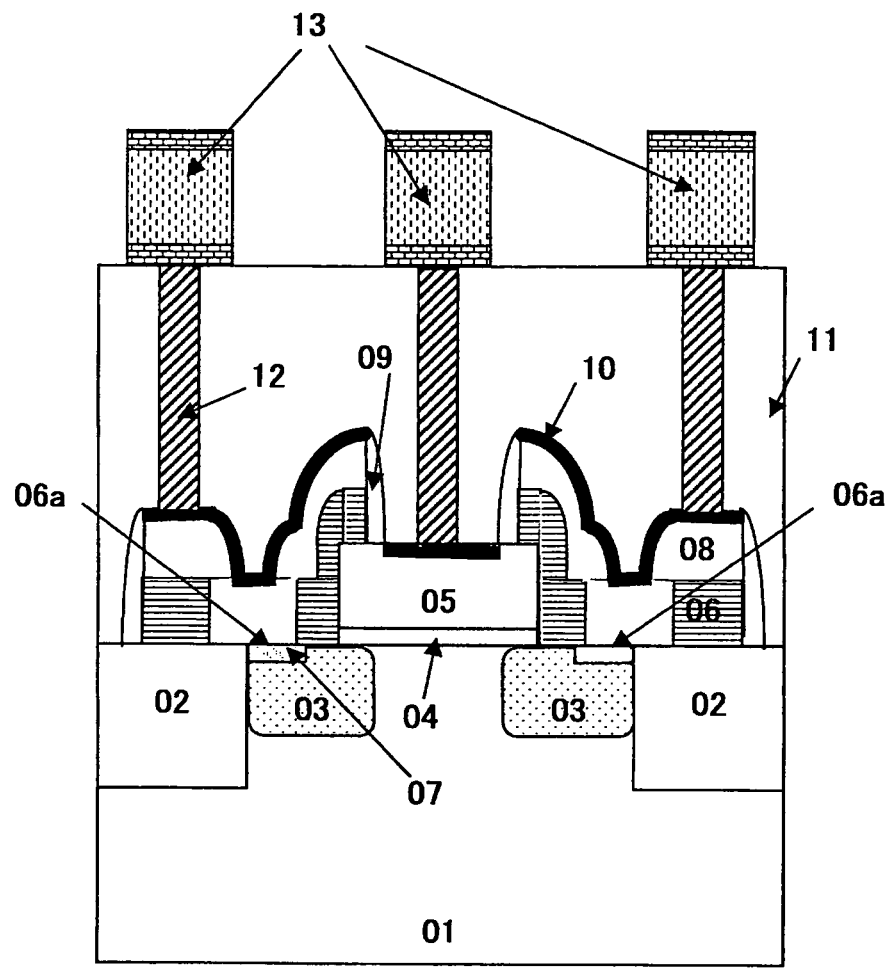
FIG. 1 is a schematic cross sectional view of a semiconductor device of the present invention.
Figure 2A:
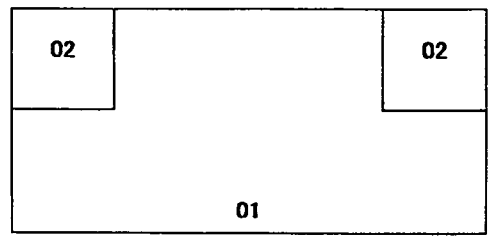
FIGS. 2(a) to 2(d) are schematic cross sectional views illustrating steps of a method for producing the semiconductor device of FIG. 1.
Figure 2B:
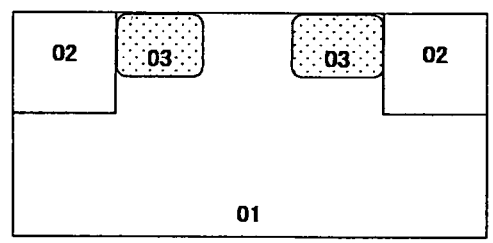
Figure 2C:
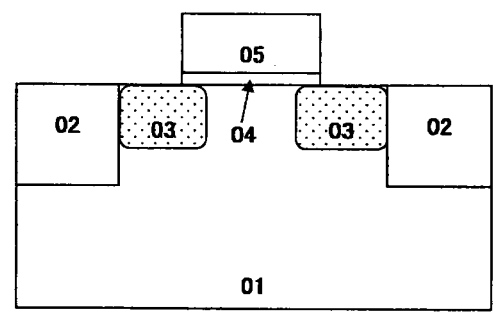
Figure 2D:
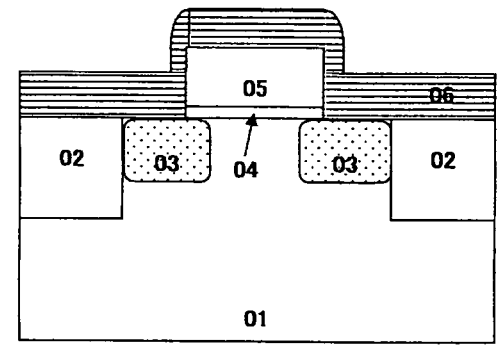

The present invention comprises at least two wiring layers on a substrate or a surface layer of the substrate, wherein a lower wiring layer of the two wiring layers contains silicon, and a silicon carbide layer is placed between the lower wiring layer and an upper wiring layer.

Silicon carbide is one of semiconductor materials as well as silicon. Compared with silicon, silicon carbide is more unlikely to be oxidized. For example, while silicon is thermally oxidized at 400° C., silicon carbide is not oxidized until temperature comes to 800° C. or more. In addition, the rate of oxidation of silicon carbide is approximately 1/10 of that of silicon. In the present invention, such characteristics of silicon carbide are used.

From the time of being pretreated by HF treatment at the surface until the time of entering to the production apparatus for the upper wiring layer, the lower wiring layer may get a natural oxide film of approximately 0.3 nm to 0.4 nm growing thereon. Furthermore, from the time of entering to the production apparatus until the time of the formation of the upper wiring layer, the lower wiring layer may get a natural oxide film of approximately 0.9 nm to 1.2 nm growing thereon. Since a silicon carbide layer is unlikely to get a natural oxide film growing thereon because of the above-described characteristics, growth of such a natural oxide film between the wiring layers can be inhibited.

In the present invention, the lower wiring layer is not particularly limited as long as it contains silicon and it is desirable to be connected to the upper wiring layer while inhibiting such a natural oxide film from forming thereon as much as possible. Examples of a combination of the lower wiring layer and the upper wiring layer include: a source/drain of an MOS transistor and contact plugs thereof; a gate electrode and a contact plug thereof; drift layers and a source/drain in the case where a source/drain is provided via a drift layer such as a withstand voltage MOS transistor; an emitter/collector/base of a bipolar transistor and contact plugs thereof; a base layer of a polyemitter type bipolar transistor and an emitter layer thereof; a capacitor electrode and a contact plug thereof; an impurity layer of a device such as a diode and a thyristor, and a contact plug thereof; a wiring layer on an interlayer insulating film and a contact plug thereof; and the like. When "/" is used for "A/B" in the description above, it means "A, B" or "A and B".

The lower wiring layer is usually formed on a substrate or a surface layer of the substrate. Examples of the substrate include a silicon substrate, a glass substrate, a resin substrate, a metal substrate, a substrate having a silicon layer on a surface thereof, and the like. Examples of the substrate having a silicon layer include a substrate having a silicon layer laminated on an insulating substrate such as a glass substrate and a resin substrate. When the silicon substrate or the substrate having a silicon layer is used, the lower wiring layer may be formed on a surface layer of the silicon substrate or the silicon layer.

The material of the upper wiring layer is not particularly limited as long as it is desired to be connected to the lower wiring layer. Examples thereof include silicon, metals such as aluminum and copper, silicides such as titanium silicide and tungsten silicide, and the like. Out of them, silicon is preferable for the reason that less space is needed for preventing current leakage generated due to diffusion of atoms that form the upper wiring layer to the underlying silicon substrate. Silicon may be single-crystal, polycrystal, or amorphous, and polycrystal silicon is preferable in terms of a balance between easiness in production and conductivity.

The lower wiring layer and the upper wiring layer are not particularly limited, and may be produced by a commonly known method according to the type thereof. When the lower wiring layer is a source/drain/drift layer, for example, it may be formed by implanting impurities to the silicon substrate or the silicon layer. In addition, such a lower wiring layer may be laminated by a CVD method or a sputtering method. The upper wiring layer may be laminated by a CVD method or a sputtering method.

In the present invention, satisfactory conduction is obtained between the lower wiring layer and the upper wiring layer, as long as these two wiring layers have a silicon carbide layer located therebetween. The silicon carbide layer may be formed on the lower wiring layer or may be formed on the surface layer of the lower wiring layer. In the former case, the silicon carbide layer may be formed by a vapor deposition method, a CVD method, a sputtering method, or the like. In addition to a normal method in which silicon is heated and deposited by evaporation in an atmosphere of a carbon containing gas (for example, $CF_4$, $CHF_3$, $CCl_4$, $CH_4$, $C_2H_2$, etc.), the vapor deposition method includes an ion plating method in which evaporated silicon is ionized and accelerated by an electric field to be attached to the lower wiring layer in an atmosphere of a carbon containing gas, thereby enhancing the attachment strength to the lower wiring layer. In the latter case, the silicon carbide layer may be formed by a method in which carbon atoms are implanted into the lower wiring layer, a method in which the lower wiring layer is exposed to RIE plasma of a carbon containing gas (for example, $CF_4$, $CHF_3$, $CCl_4$, $CH_4$, $C_2H_2$, etc.), and the like. Out of them, the method in which carbon atoms are implanted is preferable, because only carbon atoms may be readily implanted into the lower wiring layer.

In the former case, it is preferable in terms of ensuring satisfactory conduction between the wiring layers that approximately 1 atom % to 50 atom % of carbon is contained in the silicon carbide layer. In addition, it is preferable in terms of ensuring satisfactory conduction between the wiring layers that the thickness of the silicon carbide layer is 5 nm to 200 nm.

In the present invention, the latter case is preferable, because in the latter case, after the formation of the silicon carbide, the natural oxide film on the lower wiring layer is present on the top surface of the lower wiring layer as before the formation of the silicon carbide and is easily removed by HF treatment or the like, while in the former case, the natural oxide film that was present on the lower wiring layer before the formation of the silicon carbide layer remains in the interface between the silicon carbide layer and the lower wiring layer. In the latter case, it is preferable that the silicon carbide layer has a peak of the carbon atom concentration at a position 5 nm to 50 nm deep from the surface of the lower wiring layer in order to obtain more satisfactory conduction. More preferably, the position of the peak of the concentration is 5 nm to 10 nm.

Furthermore, it is preferable in terms of ensuring satisfactory conduction between the wiring layers that the carbon atom concentration at the position of the peak of the concentration (peak concentration) is $1 \times 10^{20}/cm^3$ to $1 \times 10^{22}/cm^3$. More preferably, the peak concentration is $1 \times 10^{21}/cm^3$ to $1 \times 10^{22}/cm^3$.

In terms of ensuring satisfactory conduction between the wiring layers, the carbon concentration in the surface of the silicon carbide layer is preferably $1 \times 10^{19}/cm^3$ to $1 \times 10^{22}/cm^3$, more preferably $1 \times 10^{20}/cm^3$ to $1 \times 10^{22}/cm^3$.

The silicon carbide layer of the latter case may be formed by implanting carbon atoms to the lower wiring layer at an acceleration energy of 0.6 keV to 12 keV, for example. Preferably, the acceleration energy is 0.6 keV to 5 keV. In addition, the dose of the carbon atoms is preferably $3 \times 10^{15}/cm^2$ to $3 \times 10^{17}/cm^2$ in terms of obtaining the above-described preferable impurity concentration. More preferably, the dose is $3 \times 10^{16}/cm^2$ to $3 \times 10^{17}/cm^2$.

The present invention is suitable for the case of a combination of a drift layer and a source/drain in which the lower wiring layer and the upper wiring layer include the source/drain via the drift layer such as a withstand voltage MOS transistor. The present invention is particularly suitable for a so-called stacked withstand voltage MOS transistor in which a source/drain is formed on a silicon substrate. In this kind of transistor, it is difficult to enlarge the area of the junction between the drift layer and the source/drain, and therefore the natural oxide film formed on the drift layer has greater influence on conduction between the wiring layers.

Hereinafter, will be described an example where the present invention is applied to a stacked withstand voltage MOS transistor in an embodiment.

Embodiment 1

Embodiment 1 will be described with reference to FIG. 1 to FIG. 3 (*e*). FIG. 1 is a schematic cross sectional view of a semiconductor device of Embodiment 1; and FIG. 2(*a*) to FIG. 3(*e*) are schematic cross sectional views illustrating steps of a method for producing the semiconductor device of FIG. 1.

First, trenches (for example, 0.1 μm to 1 μm in depth, 0.07 μm to 1 μm in width) are dug in a silicon substrate 01 and an insulator (for example, silicon oxide) is embedded therein, thereby forming STI (Shallow Trench Isolation) layers 02 (see FIG. 2(*a*)). A LOCOS (Local Oxidation of Silicon) layer can be formed instead of the STI layer.

Next, drift layers 03 in a relatively low concentration (for example, $1 \times 10^{14}/cm^3$ to $1 \times 10^{20}/cm^3$) are formed by ion implantation (for example, impurities: phosphorus, arsenic, antimony, boron, aluminum, gallium, indium) (see FIG. 2(*b*)).

Further, a silicon oxide layer (for example, 2 nm to 50 nm in thickness) and a polysilicon layer (for example, 0.01 μm to 1 μm in thickness) are formed and patterned by etching to form a gate insulating film 04 and a gate electrode 05 (for example, 0.03 μm to 10 μm in gate length, 0.1 μm to 100 μm in gate width) (see FIG. 2(*c*)).

Thereafter, a side wall layer 06 (for example, 0.05 μm to 5 μm in thickness) of an insulator (for example, silicon oxide, silicon nitride) is deposited on a side wall of the gate electrode 05 (see FIG. 2(*d*)).

The steps so far are the same as steps for producing an MOS transistor according to a prior art.

Subsequently, holes are made in the side wall layer 06 by photolithography and etching, thereby forming contact parts 06*a* (for example, 0.03 μm to 20 μm in width, 0.1 μm to 100 μm in depth) (see FIG. 3(*a*)). Under the contact parts 06*a*, the drift layers 03 are exposed. Thereafter, ashing and sulfuric acid treatment can be performed to remove a residue and a resist after the etching.

Thin silicon carbide layers 07 are formed on surface layers of the drift layers 03 under the contact parts 06*a* (see FIG. 3(*b*)). Here, the silicon carbide layers 07 are formed to be thin in order to hold the thickness of the silicon carbide layers to a minimum and prevent increase of an on-resistance of the MOS transistor in consideration of the fact that the resistivity of silicon carbide is approximately three times the resistivity of silicon. As a method for forming the silicon carbide layers, ion-implantation can be employed, which requires shorter treatment time and a simpler formation apparatus. The silicon carbide layers 07 preferably have a thickness to give a position of the peak carbon atom concentration at 5 nm to 50 nm deep.

When the silicon carbide layers 07 are formed by ion-implantation, it is desirable to perform implantation shallowly at an acceleration energy as small as 12 keV or less in order to give a position of the peak concentration at 50 nm or less deep, for example, because carbon is an element that has a smaller mass number. In addition, it is desirable to perform implantation at 0.6 keV or more in order to give a position of the peak concentration at 5 nm or more deep. Furthermore, the silicon carbide layers 07 containing carbon atoms in an peak concentration of $1 \times 10^{20}/cm^3$ to $1 \times 10^{22}/cm^3$ can be formed by setting the dose around $3 \times 10^{15}/cm^2$ to $3 \times 10^{17}/cm^2$.

Next, a natural oxide film on the silicon carbide layers 07 under the contact parts 06*a* can be removed by HF treatment, if necessary. Thereafter, a polysilicon layer 08 (for example, 0.01 μm to 1 μm in thickness) is deposited (see FIG. 3 (*c*)). It is desirable to use an LPCVD apparatus of a batch process type providing higher throughput for the deposition, but a CVD apparatus of a single wafer processing type can also be used.

Since the silicon carbide layers 07 for inhibiting growth of the natural oxide film are already formed by the time of the deposition of the polysilicon layer 08, no specific step or apparatus is needed to control growth of the natural oxide film at the time of the HF treatment and the deposition of the polysilicon layer 08 such as in the case of the above-mentioned prior art.

Here, the natural oxide film on the silicon carbide layers 07 is a film that has been present since before the ion implantation of carbon atoms. After this film is removed by HF treatment to expose the silicon carbide layers 07, therefore, the natural oxide film is unlikely to grow on the silicon carbide layers 07 because of the characteristics of silicon carbide. In addition, the temperature at the time of the deposition of the polysilicon layer 08 in an LPCVD apparatus is generally approximately 600° C., and silicon carbide is not oxidized until temperature comes to 800° C. or more, while silicon is oxidized at a temperature of 400° C. or more. Besides, the rate of oxidation of silicon carbide is approximately 1/10 of that of silicon. In this view, it is understood that growth of the natural oxide film can be inhibited also in an LPCVD apparatus. Thus, effectiveness of the formation of the silicon carbide layers 07 according to the present invention is clear.

Next, the polysilicon layer 08 and the underlying side wall layer 06 on the gate electrode 05 are removed by etching, thereby exposing the gate electrode 05 (the exposed part is, for example, 0.03 μm to 10 μm in width, 0.1 μm to 100 μm in depth). Further, ion implantation (impurities: phosphorus, arsenic, antimony, boron, aluminum, gallium, indium, for example) is performed on the polysilicon layer 08 and the exposed gate electrode 05 at a $10^{16}/cm^3$ to $1\times10^{22}/cm^3$) to decrease the resistance of the polysilicon layer 08 (see FIG. 3(d)). By performing the implantation so that the impurities reach the silicon carbide layers 07 via the contact parts 06a on this occasion, the resistance of the silicon carbide layers 07 can be also decreased, while the resistivity of silicon carbide is three times the resistivity of silicon.

Thereafter, annealing treatment will be performed with a furnace, an RTA (Rapid Thermal Anneal) apparatus, and the like to activate the implanted impurities. The annealing treatment has an effect of dissolving a natural oxide film between the silicon carbide layers 07 and the polysilicon layer 08 (ball-up effect). During the time that boron (B) and phosphorus (P) are present around or in the natural oxide film after the impurity ion implantation at a high concentration, the melting point of the natural oxide film is lowered, and therefore the natural oxide film can be dissolved particularly effectively.

In addition, if growth of the natural oxide film is inhibited by application of the present invention, the temperature for the above-described annealing treatment can be lowered, and the period of time for the annealing treatment can be shortened. As a result, diffusion of the impurities due to the annealing treatment is suppressed to facilitate formation of a shallow diffusion layer, and therefore impediments to miniaturization of the MOS transistor can be reduced.

Figure 3A:
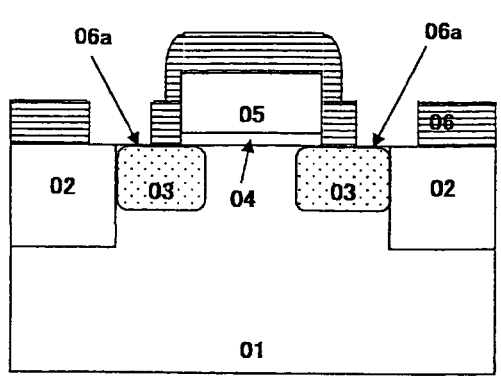
FIGS. 3(a) to 3(e) are schematic cross sectional views illustrating steps of a method for producing the semiconductor device of FIG. 1.
Figure 3D:
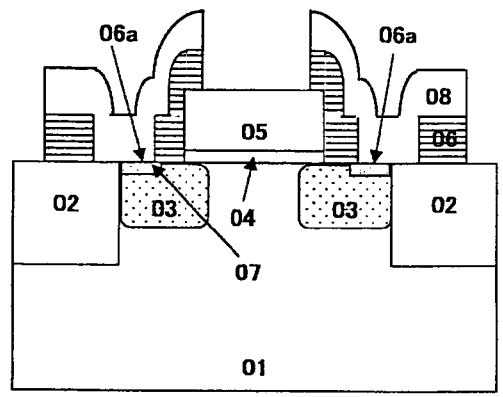
Figure 3B:
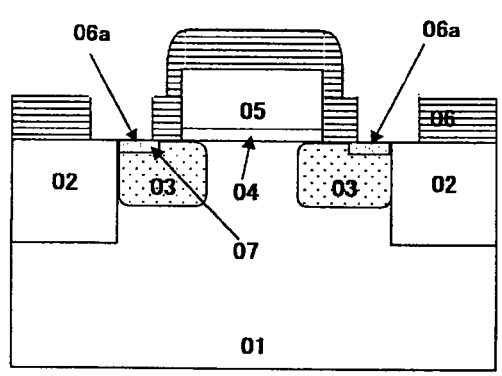
Figure 3E:
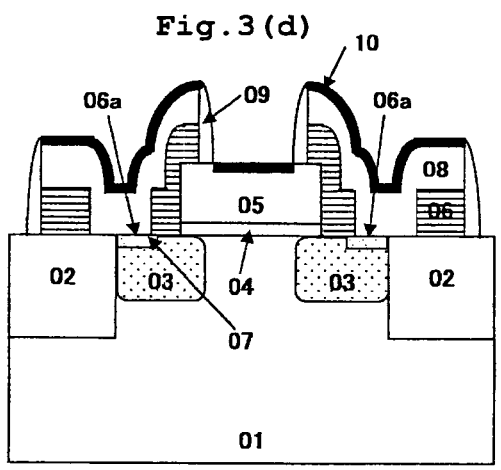
Figure 3C:
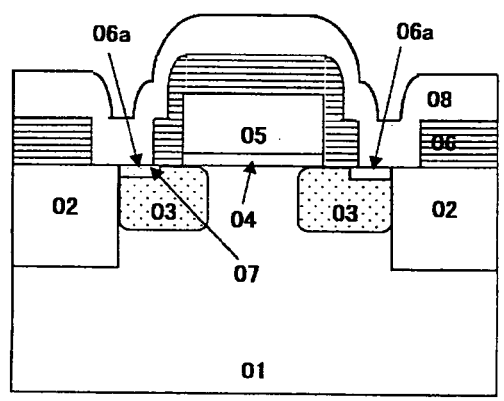

Subsequently, an insulating layer 09 is deposited on the whole area, and the insulating layer 09 is removed by etching only in a part where a salicide is to be formed, and then a salicide layer 10 (self-matching silicide layer, for example, silicide layer of titanium, cobalt, platinum, tungsten, hafnium, zirconium, nickel, or the like, 0.01 μm to 1 μm in thickness) is formed in the removed part (see FIG. 3(e)).

Further, an interlayer insulating layer 11 is formed of an insulator such as BPSG (Boron Phospho Silicate Glass), P-TEOS (an insulator formed of tetraethyl orthosilicate as a material by a plasma CVD method), and HDP (an insulator formed by a high-density plasma CVD method). Subsequently, the interlayer insulating layer 11 is flattened by CMP (chemical mechanical polishing), reflow, or the like, if necessary, and then contact holes are made by etching to form contact plugs 12. Wiring layers 13 are formed on the contact plugs 12 in the same manner as in a normal MOS transistor to obtain a semiconductor device illustrated in FIG. 1.

The present invention provides a semiconductor device attaining normal electric conduction between wiring layers, in which growth of a natural oxide film is effectively inhibited without the use of a corrosion gas that requires complicated maintenance or a complicated and expensive production apparatus by forming a silicon carbide layer which is unlikely to be oxidized compared with silicon on a lower wiring layer composed of silicon or a surface layer.

And, use of a corrosion gas that requires bothersome maintenance is not needed for the purpose of removing the natural oxide film, because presence of the silicon carbide layer inhibits growth of the natural oxide film. In addition, the production apparatus does not need to have a mechanism for conveying a wafer while keeping the wafer from being exposed to the atmospheric air for the purpose of inhibiting growth of the natural oxide film. Therefore, the production apparatus will not be complicated or upsized, and production costs can be reduced.

The invention thus described, it will be obvious that the same may be varied in many ways. Such variations are not to be regarded as a departure from the sprits and scope of the invention, and all such modifications as would be obvious to one skilled in the art are intended to be included within the scope of the following claims.

What is claimed is:

1. A semiconductor device comprising:
   at least two wiring layers on a silicon substrate or a surface layer of the silicon substrate, wherein a lower wiring layer of the two wiring layers contains silicon;
   a silicon carbide layer between the lower wiring layer and an upper wiring layer;
   a gate electrode located on the silicon substrate via a gate insulating film;
   a channel located on a surface layer of the silicon substrate under the gate electrode;
   a pair of drift layers having the channel therebetween in a channel-length direction; and
   silicon layers located on each of the pair of drift layers and working as a source/drain, wherein
   the lower wiring layer is the pair of drift layers and the upper wiring layer is the source/drain.

2. The semiconductor device as set forth in claim 1, wherein the silicon carbide layer is located on a surface layer of the lower wiring layer, and a peak of a concentration of carbon atoms forming the silicon carbide layer is at a position 5 nm to 50 nm deep from a surface of the lower wiring layer.

3. The semiconductor device as set forth in claim 2, wherein the silicon carbide layer contains carbon atoms in a peak concentration of $1\times10^{20}/cm^3$ to $1\times10^{22}/cm^3$.

4. A method for producing a semiconductor device, the semiconductor device comprising:
   a gate electrode located on a silicon substrate via a gate insulating film;
   a channel located on a surface layer of the silicon substrate under the gate electrode;
   a pair of drift layers having the channel therebetween in a channel-length direction; and
   a silicon layer located on each of the pair of drift layers and working as a source/drain, wherein
   a lower wiring layer is the pair of drift layers, an upper wiring layer is the source/drain, and the silicon carbide layer is located between the drift layers and the source/drain,
   the method comprising the steps of:
   forming a silicon carbide layer on the lower wiring layer or a surface layer of the lower wiring layer, the lower wiring layer being composed of silicon and formed on the silicon substrate or a surface layer of the silicon substrate; and
   forming the upper wiring layer on the silicon carbide layer;
   wherein the lower wiring layer is the pair of drift layers and the upper wiring layer is the source/drain.

5. The method for producing a semiconductor device as set forth in claim 4, wherein the silicon carbide layer is located on the surface layer of the lower wiring layer and formed by implanting carbon atoms to the lower wiring layer at an acceleration energy of 0.6 keV to 12 keV.

6. The method for producing a semiconductor device as set forth in claim 5, wherein the silicon carbide layer is formed by implanting carbon atoms in a dose of $3\times10^{15}/cm^2$ to $3\times10^{17}/cm^2$.

* * * * *